United States Patent
Duan et al.

(10) Patent No.: US 6,872,645 B2
(45) Date of Patent: Mar. 29, 2005

(54) METHODS OF POSITIONING AND/OR ORIENTING NANOSTRUCTURES

(75) Inventors: Xiangfeng Duan, Somerville, MA (US); Hugh Daniels, Mountain View, CA (US); Chunming Niu, Lexington, MA (US); Vijendra Sahi, Boston, MA (US); James Hamilton, Sunnyvale, CA (US); Linda T. Romano, Sunnyvale, CA (US)

(73) Assignee: Nanosys, Inc., Palo Alto, CA (US)

( * ) Notice: Subject to any disclaimer, the term of this patent is extended or adjusted under 35 U.S.C. 154(b) by 80 days.

(21) Appl. No.: 10/239,000

(22) Filed: Sep. 10, 2002

(65) Prior Publication Data

US 2003/0186522 A1 Oct. 2, 2003

Related U.S. Application Data

(60) Provisional application No. 60/370,113, filed on Apr. 2, 2002.

(51) Int. Cl.[7] .......................... H01L 21/20; H01L 29/00; H01L 51/30
(52) U.S. Cl. ....................... 438/584; 438/370; 438/378; 438/377; 438/778; 438/745; 438/962; 438/99; 257/1; 257/39; 257/302; 257/14; 257/E51.04; 257/103
(58) Field of Search ................................ 257/14, 39, 1, 257/E51.04, 103, 302; 438/584, 370, 99, 1, 49, 962, 745, 365, 377, 378, 969, 778

(56) References Cited

U.S. PATENT DOCUMENTS

| | | |
|---|---|---|
| 5,196,396 A | 3/1993 | Lieber et al. |
| 5,252,835 A | 10/1993 | Lieber et al. |
| 5,274,602 A | 12/1993 | Glen et al. |
| 5,332,910 A | 7/1994 | Haraguchi et al. |
| 5,338,430 A | 8/1994 | Parsonage et al. |
| 5,505,928 A | 4/1996 | Alivisatos et al. |
| 5,512,131 A | 4/1996 | Kumar et al. |
| 5,640,343 A | 6/1997 | Gallagher et al. |
| 5,674,592 A | 10/1997 | Clark et al. |
| 5,690,807 A | 11/1997 | Clark, Jr. et al. |
| 5,751,018 A | 5/1998 | Alivisatos et al. |
| 5,840,435 A | 11/1998 | Lieber et al. |
| 5,897,945 A | 4/1999 | Lieber et al. |
| 5,990,479 A | 11/1999 | Weiss et al. |
| 5,997,832 A | 12/1999 | Lieber et al. |

(Continued)

FOREIGN PATENT DOCUMENTS

| | | |
|---|---|---|
| WO | WO-9629629 | 9/1996 |
| WO | WO-0103208 | 1/2001 |
| WO | WO-02017362 | 2/2002 |
| WO | WO-02048701 | 6/2002 |
| WO | WO-02080280 | 10/2002 |

OTHER PUBLICATIONS

Bachtold et al., "Logic Circuits with Carbon Nanotube Transistors" (2001) *Science* 294:1317.

(Continued)

*Primary Examiner*—Matthew Smith
*Assistant Examiner*—Igwe U. Anya
(74) *Attorney, Agent, or Firm*—Matthew B. Murphy; Andrew L. Filler

(57) ABSTRACT

Methods of positioning and orienting nanostructures, and particularly nanowires, on surfaces for subsequent use or integration. The methods utilize mask based processes alone or in combination with flow based alignment of the nanostructures to provide oriented and positioned nanostructures on surfaces. Also provided are populations of positioned and/or oriented nanostructures, devices that include populations of positioned and/or oriented nanostructures, systems for positioning and/or orienting nanostructures, and related devices, systems and methods.

48 Claims, 9 Drawing Sheets

U.S. PATENT DOCUMENTS

| | | | |
|---|---|---|---|
| 6,004,444 A | * 12/1999 | Aksay et al. | .............. 204/515 |
| 6,036,774 A | 3/2000 | Lieber et al. | |
| 6,048,616 A | 4/2000 | Gallagher et al. | |
| 6,128,214 A | 10/2000 | Kuekes et al. | |
| 6,136,156 A | 10/2000 | El-Shall et al. | |
| 6,159,742 A | 12/2000 | Lieber et al. | |
| 6,190,634 B1 | 2/2001 | Lieber et al. | |
| 6,207,229 B1 | 3/2001 | Bawendi et al. | |
| 6,225,198 B1 | 5/2001 | Alivisatos et al. | |
| 6,306,736 B1 | 10/2001 | Alivisatos et al. | |
| 6,322,901 B1 | 11/2001 | Bawendi et al. | |
| 6,413,489 B1 | 7/2002 | Ying et al. | |
| 6,471,761 B2 | 10/2002 | Fan et al. | |
| 2002/0125192 A1 | 9/2002 | Lopez et al. | |
| 2002/0130311 A1 | * 9/2002 | Lieber et al. | .................. 257/1 |
| 2002/0158342 A1 | 10/2002 | Tuominen et al. | |
| 2003/0044777 A1 | * 3/2003 | Beattie | .......................... 435/6 |
| 2003/0071246 A1 | * 4/2003 | Grigorov et al. | ........... 252/500 |
| 2004/0026684 A1 | 2/2004 | Empedocles | |

OTHER PUBLICATIONS

Bjork et al., "One–dimensional Steeplechase for Electron Realized" (2002) *Nano Letters* 2:86–90.

Cao et al., "Growth and properties of semiconductor core/shell nanocrystals with InAs cores" (2000) *J. Am. Chem. Soc.* 122:9692–9702.

Chen et al., "Observation of a Large On–Off Ratio and Negative Differential Resistance in an Electronic Molecular Switch" (1999) *Science* 286:1550.

Chung et al., "Si Nanowire Devices" (2000) *App. Phys. Letts.* 76(15):2068–2070.

Collier et al., "Electronically Configurable Molecular–Based Logic Gates" (1999) *Science* 285:391–394.

Cui et al., "Functional Nanoscale electronic devices assembled using silicon nanowire building blocks" (2001) *Science* 291:851–853.

Cui et al., "Diameter–controlled synthesis of single–crystal silicon nanowires" (2001) *Appl. Phys. Letts.* 78(15):2214–2216.

Cui et al., "Doping and electrical transport in silicon wires" (2000) *J. Phys. Chem. B.* 104:5213–5216.

Dabbousi et al., "(CdSe)ZnS core–shell quantum dots: Synthesis and characterization of a size series of highly luminescent nanocrystallites" (1997) *J. Phys. Chem. B.* 101:9463–9475.

Derycke et al., "Carbon Nanotube Inter–and Intramolecular Logic Gates" (Aug. 2001) *Nano Letters* (online).

Duan et al., "General synthesis of compound and semiconductor nanowires" (2000) *Adv. Mater.* 12:298–302.

Gudiksen et al., "Diameter–selective synthesis of semiconductor nanowires" (2000) *J. Am. Chem. Soc.* 122:8801–8802.

Gudiksen et al., "Synthetic control of the diameter and length of single crystal semiconductor nanowires" (2001) *J. Phys. Chem. B.* 105:4062–4064.

Gudiksen et al., "Growth of nanowire superlattice structures of nanoscale photonics and electronics" (2002) *Nature* 415:617–620.

Haraguchi et al., "Polarization Dependence of Ligh Emitted from GaAs p–n junctions in quantum wire crystals" (1994) *J. Appl. Phys.* 75(8):4220–4225.

Haraguchi et al., "Self Organized Fabrication of Planar GaAs Nanowhisker Arrays" (1996) *Appl. Phys. Lett.* 69(3):386–387.

Hiruma et al., "GaAs Free Standing Quantum Sized Wires" (1993) *J. Appl. Phys.* 74(5):3162–3171.

Huang et al., "Logic Gates and Computation from Assembed Nanowire Building Blocks" (2001) *Science* 294:1313.

Huang et al., "Directed Assembly of One–Dimensional Nanostructures into Functional networks" (2001) *Science* 630–633.

Jun et al., "Controlled synthesis of multi–armed CdS nanorod architectures using monosurfactant system" (2001) *J. Am. Chem. Soc.* 123:5150–5151.

Kong et al., "Synthesis of individual single–walled carbon nanotubes on patterned silicon wafers" (1998) *Nature* 395:878–881.

Kong et al., "Chemical vapor deposition of methane for single–walled carbon nanotubes" (1998) *Chem. Phys. Lett.* 292:567–574.

Kong et al., "Nanotube molecular wires as chemical sensors" (2000) *Science* 287:622–625.

Liu et al., "Sol–Gel Synthesis of Free–Standing Ferroelectric Lead Zirconate Titanate Nanoparticles" (2001) *J. Am. Chem. Soc.* 123:4344.

Manalis et al., "Microvolume field–effect pH sensor for the scanning probe microscope" (2000) *Applied Phys. Lett.* 76:1072–1074.

Manna et al., "Synthesis of soluble and processable rod–, arrow–, teardrop–, and tetrapod–shaped CdSe nanocrystals" *J. Am. Chem. Soc.* (2000) 122:12700–12706.

Manna et al., "Epitaxial growth and photochemical annealing of graded Cds/ZnS shells on colloidal CdSe nanorods" (2002) *J. Am. Chem. Soc.* 124:7136–7145.

Morales et al., "A lawer ablation method for the synthesis of crystalling semiconductor nanowires" (1998) *Science* 279:208–211.

Peng et al., "Epitaxial growth of highly luminescent CdSe/CdS core/shell nanocrystals with photostability and electronic accessibility" (1997) *J. Am. Chem. Soc.* 119:7019–7029.

Peng et al., "Shape control of CdSe nanocrystals" (2000) *Nature* 404:59–61.

Puntes et al., "Colloidal nanocrystal shape and sixe control: The case of cobalt" (2001) *Science* 291:2115–2117.

Schon et al., "Field–effect modulation of the conductance of single molecules" (2001) *Science* 294:2138.

Schon et al., "Self–assembled monolayer organic field–effect transistors" (2001) *Nature* 413:713.

Service, "Assembling nanocircuits from the bottom up" (2001) *Science* 293:782.

Thess et al., "Crystalline ropes of metallic carbon nanotubes" (1993) *Science* 273:483–486.

Tseng et al., "Toward nanocomputers" (2001) *Science* 294:1293.

Urban et al., "Synthesis of single–crystalline perovskite nanowires composed of brium titanate and strontium titanate" (2002) *J. Am. Chem. Soc.* 124:1186.

Wu et al., "Block–by–block growth of single–crystalline Si/SiGe superlattice nanowires" (2002) *Nano letters* 2:83–86.

Yazawa "Semiconductor nanowhiskers" (1993) *Adv. Mater.* 5(78): 577–579.

Yun et al., "Ferroelectric properties of individual barium titanate nanowires investigated by scanned probe microscopy" (2002) *Nano letters* 2:447.

Zhou et al., "Nanoscale metal/self–assembled monolayer/metal heterostructures" (1997) *Applied Phys. Lett* 71:611.

* cited by examiner

METHODS OF POSITIONING AND/OR ORIENTING NANOSTRUCTURES

CROSS REFERENCE TO RELATED APPLICATIONS

This application is related to and claims priority from Provisional U.S. Patent Application No. 60/370,113, filed Apr. 2, 2002, which is hereby incorporated herein in its entirety for all purposes.

BACKGROUND OF THE INVENTION

Nanotubes, nanocrystals, nanowires, and particularly semiconductor nanowires have gained a great deal of attention for their interesting and novel properties in electrical, chemical, optical and other applications. Such nanomaterials have a wide variety of expected and actual uses, including use as semiconductors for nanoscale electronics, optoelectronic applications in emissive devices, e.g., nanolasers, LEDs, etc., photovoltaics, and sensor applications, e.g., as nano-ChemFETS.

While commercial applications of the molecular, physical, chemical and optical properties of these materials have been postulated for all of these different types of materials, generating commercially viable products has not, as yet, been forthcoming. In the world of devices with integrated nanomaterial elements, some of the difficulties in producing commercially viable products has stemmed from the difficulty in handling and interfacing with such small scale materials. Specifically, for the most part, these materials are produced in bulk as free standing elements that must be positioned within an operational device. Accurate and reproducible positioning of these materials has proven difficult.

Accordingly, it would be desirable to be able to provide methods of positioning and orienting nanowires on substrates or within integrated devices or systems, in a reasonably practicable fashion. The present invention meets these and a variety of other needs.

SUMMARY OF THE INVENTION

The present invention is generally directed to methods of positioning and orienting nanostructures, and particularly nanowires on substrates for subsequent use, integration or application. The invention also envisions systems for practicing such methods, devices that include oriented and positioned nanostructures, populations of positioned and/or oriented nanostructures, and systems that include such positioned and/or oriented nanostructures.

In one aspect, the present invention provides a method of depositing nanowires on a surface substantially in a desired orientation. The method generally comprises flowing a fluid containing nanowires over the surface in a first direction, where the first direction is substantially parallel to a desired longitudinal orientation of the nanowires. The nanowires in the solution are then permitted to become immobilized onto the surface, with the longitudinal dimension of the nanowires being substantially oriented in the first direction.

In a further aspect, the invention is directed to methods of positioning nanowires in one or more predetermined regions on a substrate. The methods typically comprise providing a substrate having a first surface, overlaying the first surface with a mask, where the mask provides fluid access to one or more first predetermined regions on the first surface, but not to one or more second predetermined regions on the surface of the substrate. A fluid containing nanowires is then flowed through the mask and into contact with the first predetermined regions of the substrate surface. The nanowires contained in the nanowire containing fluid are then permitted to immobilize in the first predetermined regions of the surface of the substrate.

In another aspect, the invention is directed to one or more populations of nanowires immobilized on a planar surface of a substrate, where the population(s) of nanowires are substantially longitudinally oriented in a first direction parallel to the planar surface.

Similarly, the invention includes populations of nanowires immobilized on a surface of a substrate that comprise a first set of nanowires immobilized in a first selected region of the surface of the substrate, and a second set of nanowires immobilized in a second selected region of the surface of the substrate, the second selected region being separate from the first selected region.

The invention is also directed to a nanowire based device that comprises at least a first population of nanowires immobilized in at least a first region of a surface of a substrate, the first population of nanowires being substantially longitudinally oriented in a first direction. The devices of the invention typically include at least first and second electrical contacts disposed on the first region of the surface of the substrate. The first and second electrical contacts are typically separated from each other on the first surface of the substrate in the first direction by a less than an average length of the nanowires in the population of nanowires.

The invention also includes a substrate comprising a plurality of populations of nanowires deposited upon a first surface of said substrate, wherein each of the populations of nanowires is deposited and immobilized in a separate discrete region of the surface of the substrate. In preferred aspects, electrical contacts are disposed in the separate regions such that at least one wire in the populations of nanowires bridges and connects at least two electrical contacts.

In a further aspect, the invention is directed to a system for orienting nanowires on a surface of a substrate in accordance with the methods of the invention. The system typically comprises a substrate having a first surface, a fluid channel disposed on the first surface, and a fluid direction system coupled to the first channel and coupled to a source of fluid containing nanowires, for flowing the fluid containing nanowires in a first direction through the first fluid channel.

The invention also includes, as one aspect, a system for positioning nanowires on a surface of a substrate. As above, the system includes the substrate having the first surface. A masking element is provided over the first surface which provides fluid access to separate discrete regions of the first surface of the substrate. A source of fluid that includes the nanowires or other nanostructures is provided fluidicly coupled to the fluid passages in the masking element. A fluid direction system is operably coupled to the fluid source and passages in the masking element to delver the fluid from the source to the passages, so that the nanowires in the fluid can contact and thus be immobilized upon the discrete regions of the surface of the substrate.

DETAILED DESCRIPTION OF THE INVENTION

Figure 1:
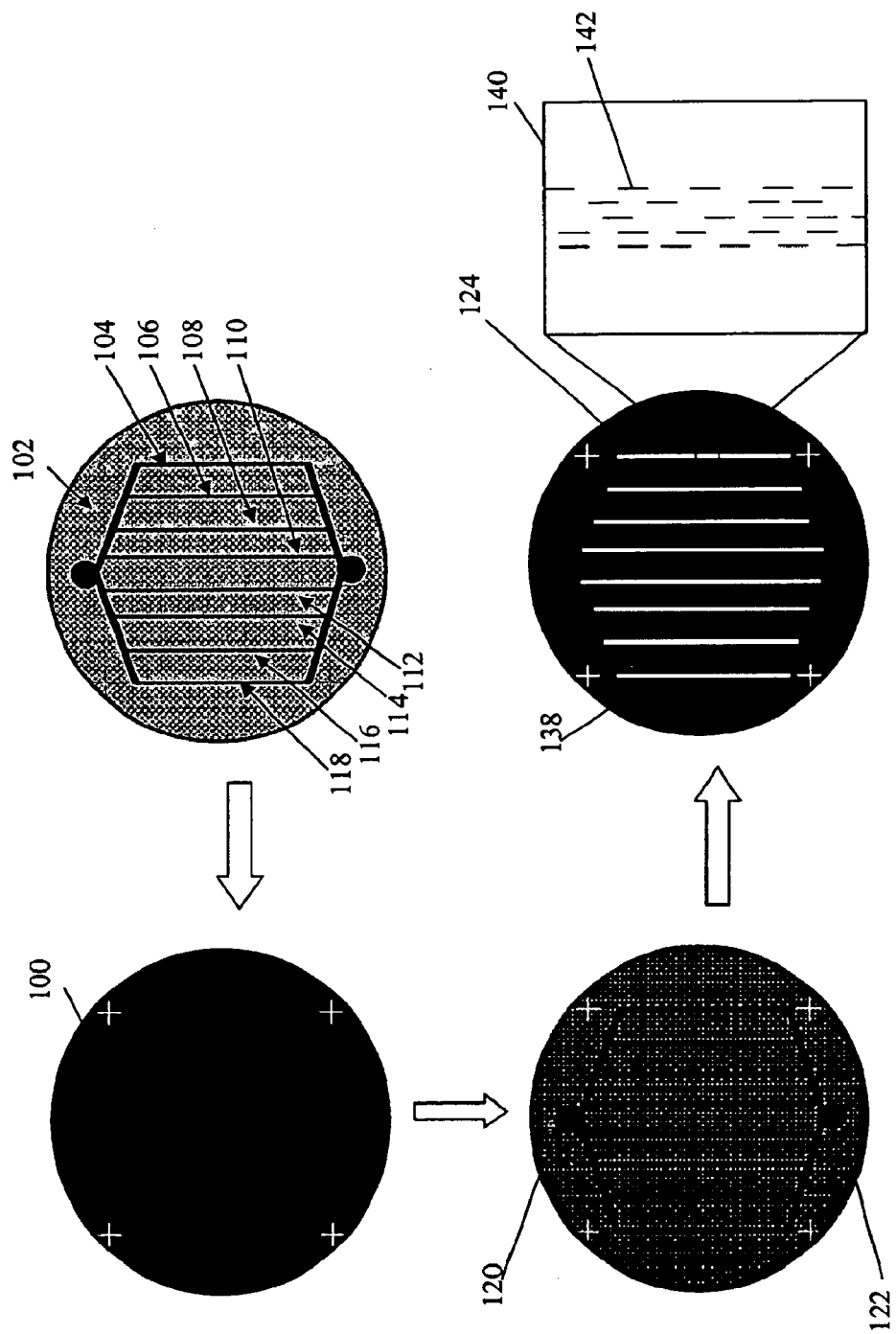
FIG. 1 schematically illustrates a wafer based process for positioning and orienting nanowires on a substrate.

The present invention is generally directed to methods of positioning and/or orienting nanowires on substrates, nanowires so positioned and/or oriented, devices produced from such oriented and/or positioned nanowires, and systems used in so orienting and/or positioning such nanowires.

As used herein, the term "nanowire" generally refers to any elongated conductive or semiconductive material that includes at least one cross sectional dimension that is less than 500 nm, and preferably, less than 100 nm, and has an aspect ratio (length:width) of greater than 10, preferably, greater than 50, and more preferably, greater than 100. Examples of such nanowires include semiconductor nanowires as described in Published International Patent Application Nos. WO 02/17362, WO 02/48701, and 01/03208, carbon nanotubes, and other elongated conductive or semiconductive structures of like dimensions. Particularly preferred nanowires include semiconductive nanowires, that are comprised of semiconductor material selected from, e.g.—Si, Ge, Sn, Se, Te, B, Diamond, P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, CaCN2, ZnGeP2, CdSnAs2, ZnSnSb2, CuGeP3, CuSi2P3, (Cu, Ag)(Al, Ga, In, Tl, Fe)(S, Se, Te)2, Si3N4, Ge3N4, Al2O3, (Al, Ga, In)2(S, Se, Te)3, Al2CO, and an appropriate combination of two or more such semiconductors. In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type is selected from a group consisting of: Si, Ge, Sn, S, Se and Te.

The present invention provides for the selective deposition of nanowires in preselected regions of substrates by providing a masking layer that masks off certain portions of the substrate surface, while providing fluid access to those portions of the substrate surface where it is desired to deposit nanowires. Fluid containing the nanowires is then directed through the mask such that the nanowires contact the desired regions of the substrate, and the nanowires are immobilized thereon. In the context of the invention, the substrate to which nanowires are immobilized may comprise a uniform substrate, e.g., a wafer of solid material, e.g., silicon, glass, quartz, plastic, etc. or it may comprise additional elements, e.g., structural, compositional etc. For example, the substrate may include other circuit or structural elements that are part of the ultimately desired device. Particular examples of such elements include electrical circuit elements such as electrical; contacts, other wires or conductive paths, including nanowires or other nanoscale conducting elements, optical and/or optoelectrical elements, e.g., lasers, LEDs, etc., structural elements, e.g., microcantilevers, pits, wells, posts, etc.

By further controlling the direction of flow of the nanowire containing fluid through the mask, one can substantially align or orient the nanowires that immobilize to the surface of the substrate. In particular, nanowires that are being deposited on a surface tend to be longitudinally oriented in the direction of flow of the carrier fluid in which they are suspended. Accordingly, one can substantially longitudinally orient nanowires on a surface by flowing the carrier fluid in a direction across the surface that is parallel to the desired longitudinal orientation of the nanowires. By "substantially longitudinally oriented" is meant that the longitudinal axes of a majority of nanowires in a collection or population of nanowires are oriented within 30 degrees of a single direction. Preferably, at least 80% of the nanowires in a population are so oriented, more preferably at least 90% of the nanowires are so oriented. In certain preferred aspects, the majority of nanowires are oriented within 10 degrees of the desired direction.

In the context of the present invention, it is generally preferred to provide for selective positioning of nanowires on certain regions of substrates while simultaneously providing for desired orientation of those nanowires. However, as will be readily appreciated, there may be a number of instances in which one aspect of the invention is more desired than the other. For example, in certain cases, it may be desired to align nanowires on a substrate surface with little or no regard for the positioning of the nanowires on that surface. Similarly, there may be instances where selected positioning of nanowires is desired with little or no regard for the orientation of the nanowires once positioned. Although the disclosure may focus a particular discussion on one aspect or the other, such discussion is generally for ease of understanding and convenience of description. It will be appreciated that in many cases, such disclosure applies equally to all aspects of the invention.

As noted previously, selective contact between nanowires and regions of a substrate is accomplished through a mask-based method, where a masking element is placed over the entire substrate surface. The mask provides for fluidic access to the desired regions of the substrate. A mask may be a simple stencil type mask where a solid layer that includes apertures disposed through it is placed or fabricated over the surface of the substrate. The apertures provide the fluid access to certain regions of the substrate surface and by directing fluid containing nanowires (or other collections of nanowires, e.g., dry powders, etc.) to the surface of the substrate, one can ensure nanowire contact, and ultimately localization and immobilization to those regions. By way of example, nanowires may be particularly targeted for positioning or localization in desired areas of the substrate, e.g., areas in which integration with additional elements is to occur, or to keep nanowires out of areas in which their presence could prove detrimental to ancillary functions of a nanowire based device. By way of example, it may be particularly desirable to ensure hat nanowires contact electrical contacts or other circuit elements, while avoiding contact with other regions of the substrate surface. By doing so, one can ensure that efforts at depositing nanowires are focused in those regions of the substrate where deposition is desired, and not in other regions where it is less desirable.

In particularly preferred aspects, however, the masking element will be somewhat more complex than a simple stencil like mask. In particular, in order to provide for both positioning and orientation of nanowires on a substrate surface, it is generally desirable to provide for directed flow of fluid across the surface of the substrate. As such, it will generally be desired to provide a masking element that provides fluidic channels across selected regions of a substrate's surface. Such masking elements are also often referred to as manifolds. In brief, one can fabricate one or more grooves into a planar substrate to provide a manifold element. This planar element is then mated with the substrate surface upon which selective deposition of nanowires is desired. The mating of the manifold element with the substrate surface encloses the groove on the manifold element and provides a channel which includes as one of its walls, a portion of the substrate surface. The groove typically includes a fluid inlet port and a fluid outlet port to permit the introduction and flow of fluid containing nanowires into and through the channel in the manifold element. In more preferred aspects, these fluidic channels disposed over the substrate surface will be microscale in cross section, e.g., having a width dimension across the substrate that is less than 1 mm, preferably, less than 500 $\mu$m, and in many cases, less than 100 $\mu$m.

One of the advantages of the present invention is its ability to be readily adapted to provide methods for larger scale production of nanowire containing devices by providing full wafer scale nanowire orientation and/or positioning processes. In particular, a nanowire containing device, like most integrated circuit devices, is typically embodied in a small chip. Like the integrated circuit industry, it would be desirable to be able to manufacture multiple devices in parallel from individual and larger wafers.

In accordance with the present invention, a substrate wafer is provided from which multiple devices are to be produced. A fluid that contains nanowires is contacted with, or in the case of flow aligned nanowires, flowed over all or one or more selected portions of the substrate in a desired direction. As noted above, for flow aligned nanowires, the direction of flow will typically dictate the substantial longitudinal orientation of the nanowires that become immobilized on the surface of the substrate.

In some cases, it is preferred to provide nanowires only on selected regions of the surface of the substrate, e.g., to minimize extraneous wire deposition, avoid wasting wires on unused portions of the substrate, etc. In such cases, a masking element is provided over the substrate surface to ensure that nanowire containing fluid only comes into contact with one or more selected regions on the substrate surface. By way of example, a channel block or manifold that includes one or more channel grooves is placed against the substrate wafer and fluid containing the nanowires is flowed through the channels in the desired direction to provided oriented nanowires in the selected locations on the wafer surface.

In order to produce multiple devices from the single wafer, multiple electrical interface components are provided on the wafer. For example, in producing multiple simple devices that includes two electrical contacts bridged by one or more nanowires, multiple pairs of electrical contacts can be provided on the substrate wafer, corresponding to each device. Typically, each pair of such electrical contacts will be provided close enough to each other in the desired direction, e.g., the direction of longitudinal orientation of the nanowires, such that a nanowire could bridge the space between the electrical contacts. Multiple pairs of electrical contacts are provided at multiple different positions on the wafer surface. The wafer containing multiple nanowire devices, e.g., one or more nanowires bridging a pair of electrodes, are then segmented into multiple separate devices.

FIG. 1 illustrates a wafer based process for producing nanowire based devices in which nanowires are oriented, positioned and integrated with electrical contacts for subsequent application. As shown, a substrate wafer 100 is provided from which multiple nanowire based devices are to be fabricated. The wafer 100 may include surface functionalization, e.g., as described herein. A masking element, such as manifold 102 is overlaid on the relevant surface of the wafer 100. The manifold includes a plurality of fluid accesses, e.g., fluid channels 104–118, to the surface of the substrate. In particular, as shown, channels 104–118 are sealed on one side by the surface of the wafer 100, as described above. These channels are coupled to fluid ports 120 and 122 as the fluid inlet and outlet ports, respectively.

The manifold or masking element 102 may take on a variety of forms and/or be fabricated from a variety of materials. By way of example, the manifold may be fabricated from rigid substrates, e.g., glass, quartz, silicon, or other silica based materials. Such materials provide ease of manufacturing, in that the elements of the manifold, e.g., the fluidic channels, can be fabricated by processes that are well known in the microfluidics, and microfabrication industries, e.g., photolithography and wet chemical etching. Similarly, polymeric materials may be used and are readily manufactured using micromolding techniques, e.g., injection molding, microembossing, etc. In some preferred cases, flexible materials are desirable as they provide enhanced contact between the manifold element and substrate surfaces that may not be perfectly flat. Examples of such materials include, e.g., polydimethylsiloxane (PDMS) and the like. Such materials are readily produced by micromolding techniques, where molds are fabricated in accordance with well known microfabrication techniques, e.g., photolithography and nickel electroforming of a master, followed by in situ polymerization of the PDMS manifold. Methods of fabricating such manifolds from a large variety of different materials are described in detail in the microfluidic patent literature, e.g., U.S. Pat. No. , 6,180,239 to Whitesides et al, and U.S. Pat. No. 5,500,071 to Swedberg et al., and U.S. Pat. No. 6,123,798 to Ghandi et al., the full disclosure of each of which are hereby incorporated herein by reference in their entirety for all purposes.

A fluid that contains nanowires is flowed into fluid inlet port 120 and through channels 104–118, and out of fluid port 122. During flow of the fluid, nanowires immobilize to the regions of the wafer surface that are included in the channels 104–118. Removal of the manifold then yields immobilized nanowire populations 124–138 in selected regions that correspond to the regions accessed by the fluid. Further, because the fluid was flowed in a selected direction, e.g., through the channels from the inlet port to the outlet port, the nanowires that are immobilized on the wafer surface in these selected regions are substantially longitudinally oriented in the direction of fluid flow, as shown by expanded view 140 which shows oriented individual wires 142.

In alternate aspects, one may employ more complex fluidic channels or fluid control systems in or attached to the manifold element to more acutely control where and how nanowires immobilize on the surface of the substrate during the deposition process. In particular, one can take advantage of fluid mechanics within the manifold channels in order to more precisely direct deposition of nanowires against a substrate surface.

FIG. 5 provides examples of channel geometries or control systems that can be used to provide for wire deposition in desired locations. By way of example, FIG. 5A shows a cross section of a fluidic channel 500, viewed from above where the fluid channels widen at the region 502 of desired deposition. By widening the channels, fluid velocity through that channel portion is slowed (the residence time of wires in this region is increased) which enhances the likelihood that wires will deposit against the substrate in these regions, e.g., shown as the dashed oval 504. Alternatively, as shown in FIG. 5B, channel regions 510 that have regions with shallower depths 512, e.g., shorter diffusion distances required to be traversed to reach the substrate surface, may be provided. By providing a shorter diffusion distance between the fluid and the substrate surface region of interest, e.g., region 514, again, one may enhance the rate at which wires contact and are deposited on the desired surface regions.

Figure 5C:
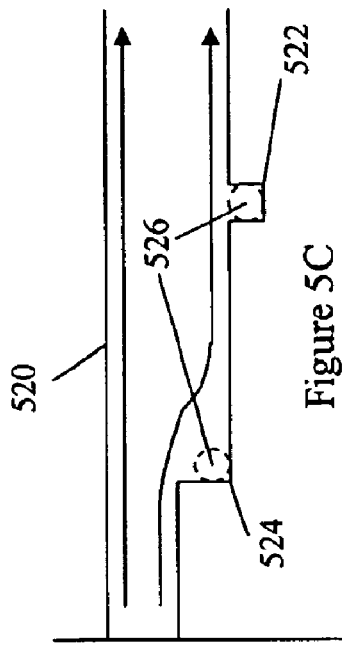
FIGS. 5A–5D show schematic illustrations of different fluidic channel structures designed to achieve different deposition patterns of nanowires on substrate surfaces.

In other aspects, flow irregularities may be provided by the channel geometry which yield aggregation or deposition of particulates, e.g., nanowires in desired regions. By way of example, and as shown in FIG. 5C, one may provide channels 520 that include coves 522 in the channel geometry, or corners 524 at which will function as deposition zones 526 as a result of eddies or other recirculating flows that contain nanowires in these regions for extended times. Streamlines are indicated by the dashed arrows.

Figure 5D:
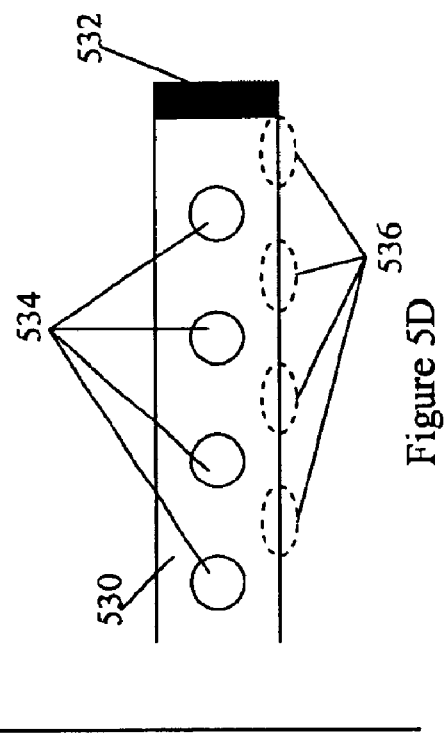
Figure 5A:
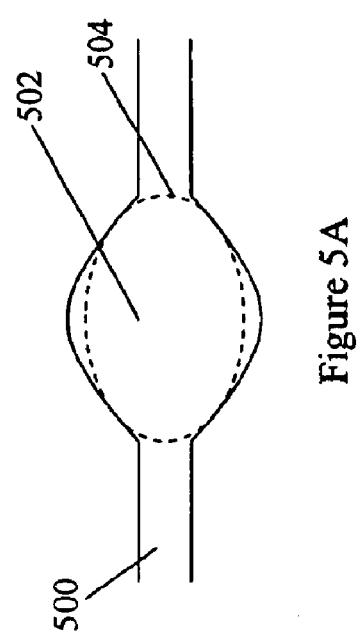
Figure 5B:
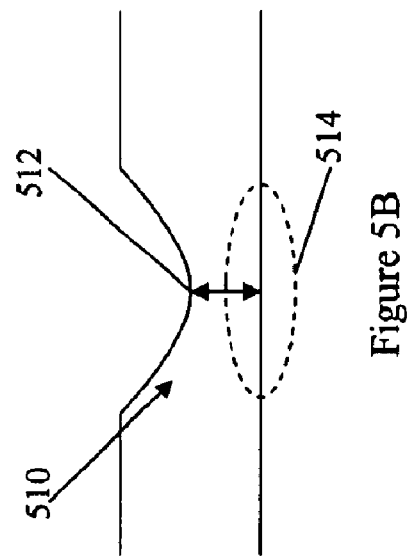

In a further aspect, one may employ other means for preferentially depositing wires in certain locations. One such example involves producing standing wave patterns in the fluid containing the nanowires over the surface of the substrate. Such standing waves can be used to create regular periodic patterns of nanowires deposited on the substrate surface. FIG. 5D schematically illustrates a fluid channel 530 and wave generator 532, as well as an exemplary deposition pattern for the nanowires on the surface of the substrate. As shown, a series of standing rolls 534 is set up within a fluid containing channel that yields periodic deposition of nanowires, e.g., in zones 536. In addition, interfering waves could be set up in other directions, e.g., orthogonal to the first standing wave, to provide more precise localization of deposited wires. Wave generators that are particularly useful in accordance with this aspect of the invention include piezoelectric elements that provide high frequency vibrations to the fluid within the channel.

Positioned and oriented nanowires are far more amenable to integration with electrical elements in a controlled, high yield fashion. In particular, by providing populations of positioned and oriented nanowires, e.g., populations 124–138, one can more precisely select locations for electrical contacts, in order to maximize the likelihood of functional connection between nanowires and electrical contacts or other elements. By way of example, if one has a population of nanowires that are randomly dispersed within a relatively small area, but are oriented to be pointing substantially in one direction, one can provide electrical contacts within that small area and spaced apart in the direction of orientation by a distance that will likely be spanned by at least one nanowire. Such a distance can be selected to be less than the average size of the nanowires in the population of nanowires. To ensure greater likelihood of spanning the contacts, one could place them at a distance that is less than 90% of the average length, less than 80% of the average length, less than 70% of the average length, and in some cases, less than 50% of the average length of the nanowires in the population. Of course, the closer together the contacts, the more likely it becomes that one or many nanowires will bridge the two electrical contacts. Although described in terms of two electrical contacts, it will be appreciated that the nanowires may be integrated with a wide variety of other elements, including multiple, e.g., more than two electrical contacts, other circuit elements or nanoscale structures or elements fabricated into or onto the substrate (see, e.g., commonly owned Provisional U.S. patent Application No. 60/392,205, filed Jun. 27, 2002 and incorporated herein by reference in its entirety for all purposes), structural elements, e.g., ridges, posts, walls, etc., optical elements, or virtually any other element that would be employed in a device that comprises nanowires.

Integration of the populations of nanowires on the wafer with electrical elements can either be concurrent with the immobilization process or it can take place in a subsequent separate step. In particular, the wafer may be pre-patterned with electrical contacts, such that immobilization of nanowires in selected regions corresponding to the positions of the electrical contacts yields wires that bridge the contacts. Alternatively, the electrical contacts may be patterned over the nanowires (or at least portions of the nanowires) that are immobilized on the wafer.

Figure 2:
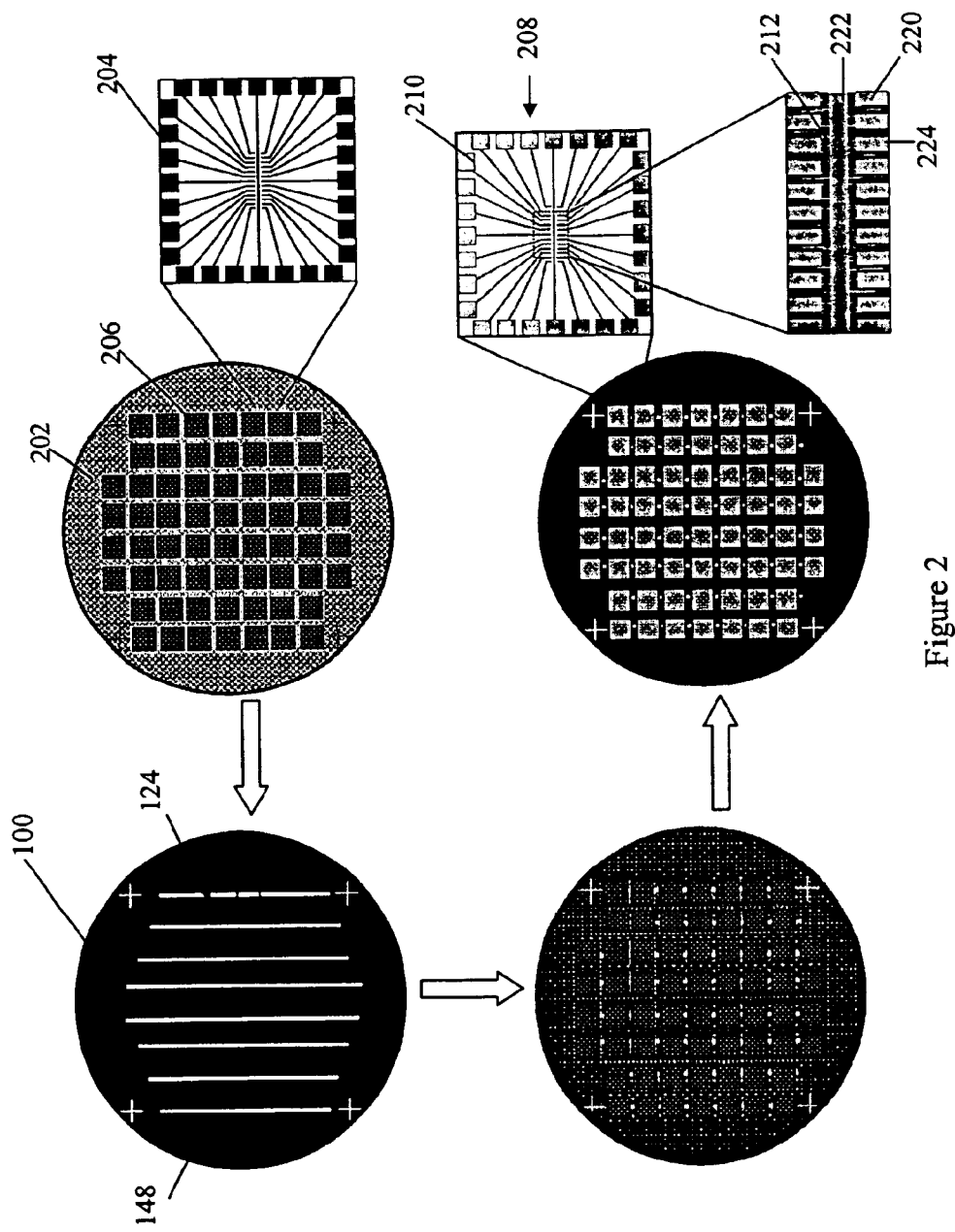
FIG. 2 schematically illustrates the integration of electrical elements with positioned and oriented nanowires on a wafer substrate.

As shown in FIG. 2, a number of metallization patterns can be provided on a wafer. As shown in FIG. 2, a wafer 100 that has nanowire populations 124–138 deposited thereon is subjected to further processing to deposit electrical elements onto it. As noted above, however, electrical elements may be prepatterned onto the substrate. A metallization pattern is established on the substrate using conventional photolithographic processes, e.g., photolithographically defining and developing a pattern in a resist coating over the substrate, followed by e.g., evaporative deposition or sputtering of metal electrodes in the open regions. As shown, a photomask 202 that corresponds to the desired electrode pattern 204 is used in the photolithographic definition of the electrode patterns. As can be seen, the wafer based process produces multiple discrete devices (each corresponding to a square 206 in the photomask). Once the electrodes are laid down on the substrate, the mask is removed to yield a wafer with multiple integrated devices 208, where each device includes a discrete pattern of electrodes 210 that are connected by nanowires 212 within each population of nanowires. As shown, the electrode patterns are targeted to be overlaid upon the regions where the different populations of nanowires are deposited, to maximize the potential of accurate integration of the two elements.

As shown, the electrical contact patterns also employ elements of efficiency. In particular, as shown, a common electrode 222 is provided for all device elements in a discrete device. In particular, while a number of nanowire based devices are provided, e.g., the wire connection between electrode 224 and 222 and between electrode 220 and 222, both elements share the common electrode 222. This permits the easier connection of the electrical contacts for all of the elements within a given device with other portions of an overall system. In the case of operable devices, it will be readily appreciated that each device may include a single wire connection or may include multiple connections, e.g., as shown in FIG. 2. Further, these connections may be of the same type, e., wires of the same composition, or with surface treatments that are the same, e.g., attached ligands, antibodies, nucleic acids, etc. (for sensor applications). Alternatively, each device may comprise multiple different wire connections, e.g., wires that have a different basic composition or surface binding element. For a discussion of sensor based applications of nanowire based devices, see, e.g., U.S. Provisional Patent Application No. 60/392,205, filed Jun. 27, 2002, and Cui, et al., Science 293, 1289–1292 (2001), the full disclosures of which are incorporated herein by reference in their entirety for all purposes.

Again, as noted above, each metallization pattern 210 corresponds to an individual device. As shown in the expanded view, each metallization pattern 210 includes a series of patterned electrical contacts/traces, e.g., contacts/traces 220, 222 etc. The pairs of electrical contacts, e.g., contact 220 and 222, are spaced apart from each other by a distance that has a desired likelihood of having a desired number of nanowires that span the two electrical contacts. In particular, if one has a population of nanowires where the average length of nanowires is approximately 10 μm, one can increase the likelihood of one or more wires spanning two electrical contacts by placing them less than 10 μm apart. The closer the electrical contacts are together, the more likely it will be that at least one nanowire sill span the two contacts. Thus, in some cases, the electrical contacts will be less than 5 μm apart, and in other cases, less than 1 μm apart.

As will be readily appreciated, the methods described herein are not limited to single sets of nanowires oriented in a single direction, but can be used to provide substrates that include nanowires oriented in any desired direction. Such differently oriented nanowires can be positioned at different locations on a substrate or substrate wafer, or they can be provided in the same location, e.g., layered, so as to provide arrays of crossed, but electrically or structurally coupled nanowires. Alternatively, such layered structures may simply be used to provide a three dimensional architecture for a device, e.g., where each layer of nanowires is separated by an intermediate layer.

For example, following immobilization and orientation of nanowires in a first direction, the manifold element may be rotated and additional nanowires immobilized and oriented on the surface of the substrate. The result is populations of nanowires positioned on a substrate that are oriented in a first direction that overlap with populations of nanowires oriented in a different direction. Nanowires that are differently oriented may comprise the same composition or they may comprise different compositions. For example, a first population of semiconductor nanowires that is p doped may be positioned and oriented in a first direction. A second population may be positioned and oriented orthogonally to the first set and may include n-doping. The resulting p-n junction could then be used for a variety of different applications, including, e.g., optoelectronic applications, memory and logic applications, and the like, e.g., as discussed in Published PCT Application Nos. WO 02/17362, WO 02/48701, and 01/03208, the full disclosures of which are hereby incorporated herein by reference in their entirety for all purposes.

Figure 4:
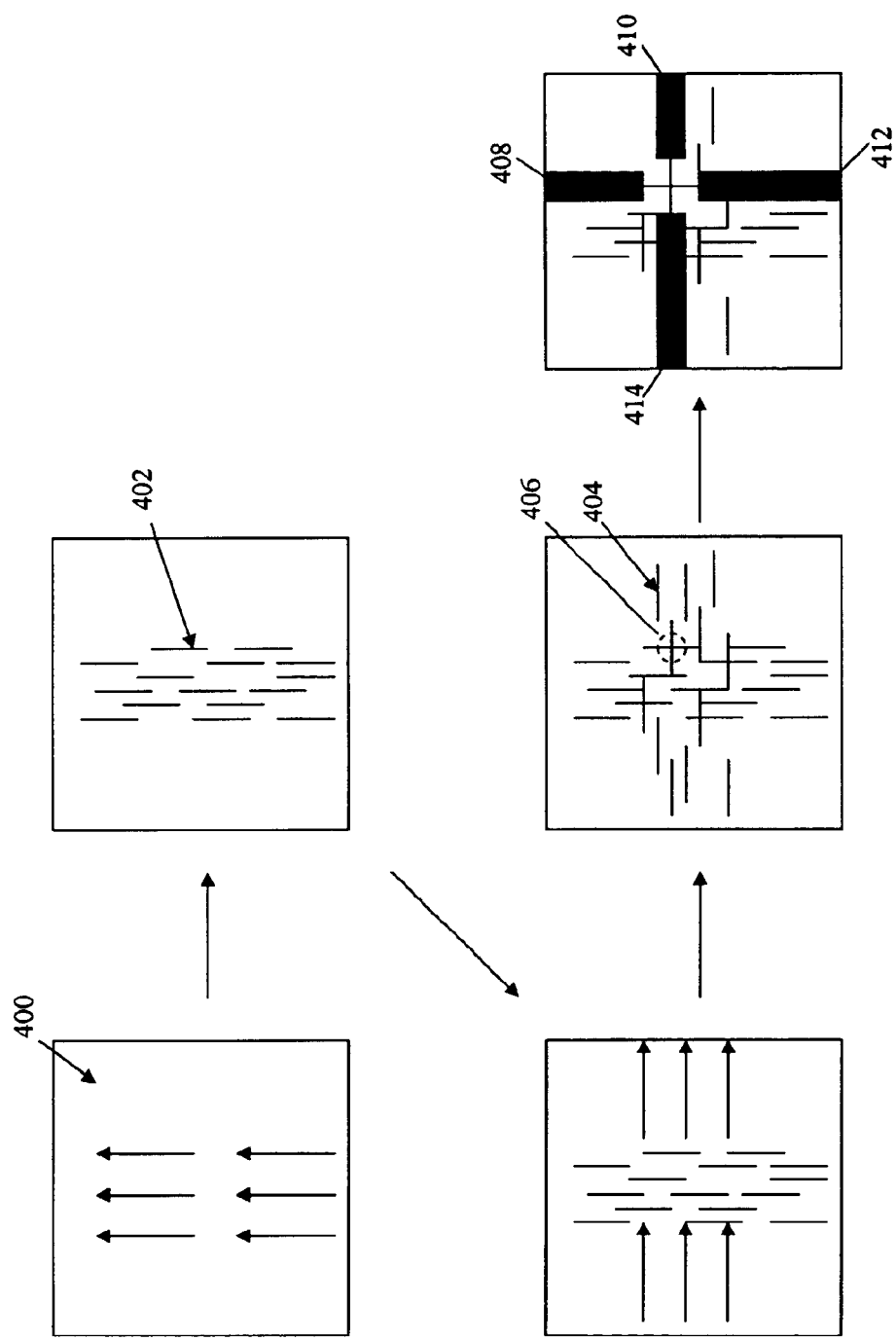
FIG. 4 shows a schematic illustration of bidirectional orientation of nanowires in accordance with the processes described herein.

Bidirectional or multidirectional orientation of nanowires is schematically illustrated in FIG. 4. As shown in FIG. 4, fluid containing nanowires is flowed in one direction over the substrate surface region 400 where wire deposition is desired. This results in the deposition and immobilization of wires 402 in this region where the wires are substantially longitudinally oriented in the direction of flow. Fluid containing wires are then flowed over the same substrate region 400 in a different direction, e.g., orthogonal to the original direction of flow and orientation. This results in deposition and immobilization of wires 404 on the same substrate region oriented in the different direction. This will result in a certain number of cross wire junctions 406 being formed on the substrate surface. By then adding electrical contacts 408, 410, 412 and 414, either before or after the addition of wires, one can establish integrated electrical cross junctions, which may include wires of like or different composition, e.g., doping.

In an alternative arrangement, and as discussed above, integrated nanowire junctions may be created from a first nanowire that is fabricated onto the surface of the substrate by more conventional means, e.g., e-beam lithography or the like (see, Provisional Application No. 60/392,205, previously incorporated herein by reference). Such "integrated circuits" may be readily combined with the free standing nanostructures in accordance with the present invention, as can other integrated circuit elements, e.g., elements that are fabricated into or onto the surface of the substrate prior to adding the nanostructure element as described in the present invention. A second nanowire is interfaced with the first using the flow based alignment methods described herein. By way of example, a thin nanowire element may be fabricated from an SOI wafer where the relevant semiconductor is p-doped. An n-doped, free standing nanowire is then deposited across the first wire element to provide a p-n junction. A variety of different junction types may be created in this manner, including simple switches, etc. as described above.

As described above, the methods of the invention involve the immobilization of nanowires onto a surface of a substrate. As used herein, the term "immobilization" refers to the coupling of a nanowire with the substrate surface, or chemical groups on that surface, such that the nanowire remains in position on the substrate surface despite being contacted by fluids, moving air or gas, etc. Immobilization may be permanent or reversible. Typically, immobilization is the result of chemical interaction between the surface or chemical groups on the surface and the nanowires themselves, or chemical groups on the nanowires. Such interactions include, e.g., ionic interactions, covalent interactions, hydrophobic or hydrophilic interactions, and electrostatic or magnetic interactions.

In the case of certain substrates and nanowires, the existing surfaces of the substrate and the nanowire may provide sufficient attraction between the substrate and the nanowire to provide immobilization. For example, where the nanowires and substrate surface are generally hydrophilic, one could dispose the nanowires in a hydrophobic solvent to contact them with the surface. As a result, the favored reaction would be for the nanowires to associate with the substrate surface, resulting in immobilization. Alternatively, and in particularly preferred aspects, one may provide surface functionalization on one or both of the substrate and/or the nanowire that facilitates coupling between the two.

Figure 3:
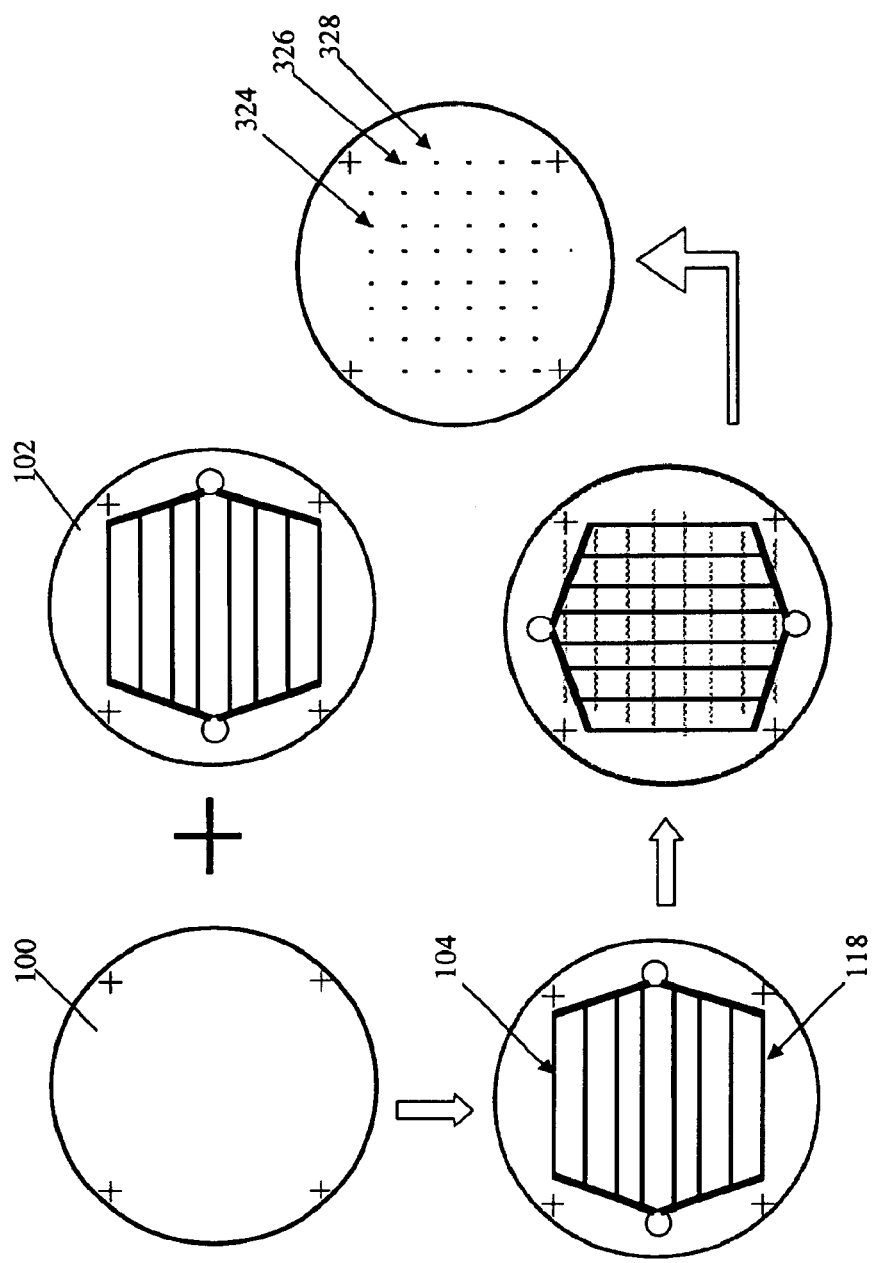
FIG. 3 is a schematic illustration of patterned substrate functionalization followed by positioning and orienting of nanowires.

In functionalizing the substrate surface, where such functionalization is necessary or desired, one may provide the ability to couple the nanowires to an entire substrate surface and rely upon the masking step to selectively position nanowires, or one may also provide only selected regions of functionalized surfaces to further selectively position nanowires on the surface. In particular, one may functionalize only first selected regions on the substrate or wafer. Then, by masking off other selected regions that include portions of the functionalized regions, one can further control how nanowires are coupled to the surface of the substrate. FIG. 3 illustrates such a process using the same manifold 102 for surface functionalization followed by nanowire deposition. As shown, manifold 102 is placed over wafer 100, and appropriate functionalization chemistry is directed through the channels of the manifold. This results in derivatized surface regions that correspond to channels 104–118. The manifold is then rotated, e.g., 90°, and nanowire containing fluid is directed through the manifold. Because only a portion of the surface which the nanowires contact is functionalized, the nanowires will be positioned and oriented substantially only in those regions. When the manifold is removed, it yields a substrate in which nanowires are only immobilized in selected small regions, e.g., regions 324, 326, etc., that were both functionalized, and exposed to nanowires. This provides for even more precise control over positioning of the wires. For example, one can target the functionalization to provide more precise localization of nanowires in the desired regions, such as functionalizing the surface of the electrical contacts, but no other portions of the substrate surface, in order to assure that the wires immobilize only to the electrical contacts, or in the regions where electrical contacts are to be provided.

Functionalization of the surface may be carried out by a variety of means. For example, as discussed above, functionalization may be directed at an entire substrate surface, or it may be patterned or chemically templated onto the substrate surface. As used herein, the term "chemical template" generally refers to the deposition and/or reaction upon a substrate surface of a template that is defined by chemical modification of that substrate surface. In particular, chemical modification of the surface in selected regions will make it more likely that a nanostructure will localize to a particular region, e.g., a desired region, than in another region, e.g., an undesired region. Chemical modification can be positive modification, e.g., the region of modification provides enhanced affinity of the nanostructure to the substrate, or it can be negative, e.g., it provides a repulsing effect such that nanostructures are unlikely to localize in the particular region. Chemical modifications include any of a variety of different surface treatments that are well known in the art of surface chemistry, including coupling of active groups that are capable of bonding to or otherwise associating with the nanostructures or with chemical groups disposed upon those nanostructures. The functional chemical groups presented may interact with the nanostructures via affinity interactions, ionic interactions, hydrophobic and/or hydrophilic interactions.

As noted above, the substrate may comprise a bare substrate or may include other elements, including other device elements and/or other nanostructures, e.g., electrodes, nanowires, circuit elements, etc. The chemical moieties may be an element of the substrate, or they may be coupled, either directly or through a linker molecule, or otherwise provided upon the surface of the substrate in the desired pattern or at the desired locations or regions of the substrate's surface.

One arrangement for capturing nanostructures involves forming surfaces that comprise regions that selectively attract nanostructures. For example, —$NH_2$ moieties can be presented in a particular pattern at a surface, and that pattern will attract nanowires or nanotubes having surface functionality attractive to amines. This same surface functionality is also optionally used to generate an ionic attraction whereby surface amines are exposed to an acidic environment resulting in a predominantly positively charged surface, e.g., populated with $NH_3^+$ groups that can attract negatively charged nanostructure surfaces or repel like charged materials. Surfaces can be patterned using known techniques such as electron-beam patterning, soft-lithography, or the like. See also, International Patent Publication No. WO 96/29629, published Jul. 26, 1996, and U.S. Pat. No. 5,512,131, issued Apr. 30, 1996.

Templates may have inherent affinity toward nanostructures, or may be provided such that the affinity can be accentuated. For example, in preferred aspects, chemical templates are generated by providing protected functional groups over the surface of the substrate upon which the nanostructures are going to be provided. Desired portions or regions of the substrate surface are then deprotected, e.g., the protecting groups are removed or transformed, to yield an active site to which nanostructures will bind or otherwise be localized. As alluded to above, the regions of the substrate that are deprotected may comprise a basic substrate surface, e.g., a $SiO_2$ substrate, or they may include other elements, including functional elements, on the surface of a basic substrate. For example, a chemical template may define regions only on the surfaces of electrical contacts that are present on a basic substrate, and not elsewhere on the substrate surface, so as to increase the likelihood that nanostructures, e.g., nanowire(s), will be coupled to those electrodes, and nowhere else.

In a first aspect, photodeprotection is used to provide a chemical template for directed positioning of nanostructures. In particular, a substrate to which nanostructures are to be coupled, bound or otherwise associated, is treated to provide a layer of chemical moieties that include active functional chemical groups that would interact, e.g., bind, to a nanostructure, but for the presence of a protecting group coupled to that active group. In accordance with this aspect of the invention, the protecting group provided on the active group is a photolabile protecting group. Specifically, in order to activate the molecules on the surface of the substrate, one must expose the photolabile protecting group to light of a desired wavelength, to remove the protecting group and yield the active chemical moiety with which a nanostructure may interact/bind. By selectively exposing desired regions of the substrate, one can selectively activate a pattern of regions on that surface and drive the selective positioning of nanostructures accordingly. Such selective exposure can be carried out using standard photolithographic techniques, e.g., mask-based exposure, laser writing, e-beam lithography, etc. that are very well known in the art.

A wide variety of photolabile protecting groups and their associated linkage chemistries, e.g., that couple other elements to surfaces, once activated, are well known in the art, and have been used extensively in the directed positioning of chemical elements on substrate surfaces. By way of example, in at least one aspect of the invention, amino or hydroxyl terminated organosilane linker molecules are provided coupled to the substrate surface. The linker group is capped by a protecting group that is cleaved or rendered cleavable upon exposure to light of a desired wavelength. Examples of known photolabile protecting groups include nitroveratryloxycarbonyl protecting groups, such as NVOC and MeNVOC, as well as nitropiperonyloxycarbonyl protecting groups, such as NPOC and MeNPOC, and others, e.g., PyMOC. The use of these protecting groups and others in photolithographic activation of surfaces is described in, e.g., U.S. Pat. Nos. 5,489,678 and 6,147,205, the complete disclosures of which are hereby incorporated herein by reference in their entirety for all purposes.

In alternative arrangements, functional groups may be in an ionizable form, such that under certain conditions, e.g., low or high pH, the functional group has substantial affinity for the nanostructure, e.g., a strong positive or negative charge, while under different environmental conditions, the affinity is substantially lower, or is even negative.

In certain aspects, the organosilane polymer is terminated with a hydrophilic moiety. In such cases, the natural affinity of the nanowire components, e.g., for semiconductor nanowires, to the hydrophilic moiety provides the selectivity of binding in the overall positioning process. Examples of linkers including such hydrophilic terminators include, e.g., (hydroxy/amino) propyltriethoxy silane derivatives and poly(hydroxy/amino)propyltriethoxysilane derivatives. To take advantage of an increase in hydrophilicity, protecting groups for this particular embodiment would be generally hydrophobic in nature. Cleavage would then yield an increase in hydrophilicity at the desired location. Use of relatively hydrophilic and hydrophobic surface templates has been described for use in, e.g., in situ chemical synthesis for biochemical microarrays (see, e.g., U.S. Pat. No. 5,985,551, to Brennan et al.).

In this case, following exposure of the desired regions to expose the hydrophilic moiety in the desired regions for coupling nanostructures, a fluidic suspension of nanostructures is flowed over or otherwise contacted with the entire substrate. The affinity of the nanostructures, e.g., semiconductor nanostructures, for the hydrophilic regions provides for the preferential localization of the nanowires in the deprotected regions. Such regions may include regions between and including electrical contacts, or between electrical contact(s) and other nanostructures, or regions on substrates where subsequent additional elements will be patterned to contact the nanostructures so deposited.

While described in terms of hydrophilic affinity, it will be appreciated that a variety of different interactions may be exploited in the attraction and/or repulsion of nanostructures within the selected pattern, including hydrophobic interactions, e.g., in regions where it is not desired to have binding, combined hydrophobic/hydrophilic interactions, specific molecular affinity interactions, e.g., antibody:antigen, aviden:biotin, nucleic acid hybridization,, or ionic interactions.

In the cases of affinity interactions (and even in other non-affinity cases, where higher efficiency coupling is desired), it may be necessary or desirable to provide a functional group on the nanowire to permit the desired interaction between the nanowire and the substrate, e.g., a complementary molecule to that disposed on the substrate surface. In such cases, and particularly with reference to semiconductor nanowires, e.g., silicon nanowires, derivatization of the nanowire may be carried out according to methods used to derivatize the substrate surface of like make-up. For example, nanowires may be silanized for attachment to the substrate surface, either directly or through an intermediate group. In particular, in the same fashion described for derivatizing the surface of the substrate, supra, one could derivatize the nanowire itself. Such derivatization could include addition of affinity molecules, hydrophilic or hydrophobic groups, ionic groups, etc. as desired to improve efficiency of the positioning process. In addition, functionalization of the nanowire provides facility in adding additional components to the nanowire element, i.e., for attachment of biomolecules for biosensor applications (see, e.g., U.S. Patent Application No. 60/392,205, previously incorporated herein). Thus, in certain cases both the nanowire and substrate may be derivatized to facilitate binding and improve efficiency of the positioning process.

Additionally, or alternatively to the photo-deprotection process described above, patterning of a surface for nanostructure attachment may utilize chemical deprotection methods, e.g., acid deprotection. Acid deprotection generally utilizes acid labile protecting groups in place of the photolabile protecting groups described above. Directed exposure of regions to acid may be accomplished through mechanically directed means, e.g., channeling acid to the desired regions while preventing the acid from reaching other regions. Such mechanical means can include the use of channel blocks mated with the substrate, template masks. However, such methods often yield low resolution due to the difficulty in sealing the channel block to the substrate surface. Other mechanical methods include ink jet printing methods, microcontact printing methods, etc.

For modification of electrodes to increase affinity, one could provide the patterned electrodes with a thin gold layer as the chemical moiety to increase affinity, and treat the nanostructures with thiol terminated organosilanes. The thiolated nanostructure would then bind preferentially to the gold electrode.

Alternatively, photoresist layers are used to generate a mechanical stencil or mask for subsequent acid exposure. In particular, a resist is coated on a substrate that includes acid labile protecting group capping the functional groups. The resist is exposed and developed, e.g., removed, in the desired regions and the exposed portions of the substrate are subjected to acid deprotection while the unexposed regions are not. In still more preferred aspects, an acid generating resist is used, where exposure of the resist in the desired locations results in generation of an acid which in turn deprotects the functional groups in those desired locations. This latter method has an added advantage of reducing the number of required process steps, in that the exposure and acid deprotection steps are concurrent.

Examples of both acid labile protecting groups and acid generating photoresists are well known in the art and include, e.g., DMT (dimethoxytrityl) and its derivatives, as well as acid generating resist layers that are generally commercially available.

Although described primarily in terms of photolithographic patterning techniques, it will be appreciated that other patterning techniques, such as microcontact printing techniques, laser ablative techniques (either direct or in conjunction with a resist layer, i.e., PMMA), and the like may be employed in the patterning steps. Such methods are generally well known in the art and are described in, e.g., U.S. Pat. No. 6,180,239 to Whitesides et al, and U.S. Pat. No. 5,500,071 to Swedberg et al.

For other applications, different protecting group types may be employed, e.g., allyloxycarbonyl (ALLOC), fluorenylmethoxycarbonyl (FMOC), —NH-FMOC groups, t-butyl esters, t-butyl ethers, and the like. Various exemplary protecting groups are described in, for example, Atherton et al., (1989) Solid Phase Peptide Synthesis, IRL Press, and Greene, et al. (1991) Protective Groups In Organic Chemistry, 2nd Ed., John Wiley & Sons, New York, N.Y.

For the steps of selectively patterning nanowires onto the surface, through the use of a masking element, while in preferred aspects, the masking element or manifold is provided as a separate element or layer that is removably placed against the substrate surface, it will be appreciated that this element may be fabricated onto the surface of the substrate, e.g., in the same fashion as described with reference to chemical templating of the substrate surface. Further, this masking element may remain permanently on the surface of the substrate, or it may be removed through subsequent processing of the substrate. In particular, a manifold element may be fabricated onto a substrate or substrate wafer surface by coating a layer of material, e.g., a polymeric resist layer on the substrate. In preferred aspects, polymeric resists, and preferably photoresists are spin coated onto wafer surfaces. As described above, the substrate may include electrical contacts pre-patterned onto the surface of the wafer. Similarly, the surface may be pre-functionalized in first selected regions for coupling to nanowires, as described above.

Following coating of the layer that is to form the manifold or masking layer onto the substrate surface, passages are defined through that layer, typically as troughs, trenches or fluid channels in the layer to provide fluid access to the surface of the substrate. By using a photoresist as the masking layer, one can simply use the recommended exposure and development processes for the resist used to define the passages. Once the masking layer is defined on the surface of the substrate, fluid containing the nanowires is flowed over the substrate and/or specifically through the defined channels or troughs in the desired direction in order to allow the nanowires to be immobilized on the substrate surface in the desired orientation. As will be appreciated, enclosed or sealed channels are generally preferred for flowing nanowires in a desired direction. As such, in preferred aspects, an additional cover layer is optionally and preferably disposed over the masking layer to provide flow channels, like with a manifold. While either positive or negative resists may generally be employed in accordance with the invention, for use in templating, it will be generally desirable to use positive photoresists, as they are less prone to swelling in aqueous solutions or in ethanol, which is often employed as the fluid carrier for nanostructures, e.g., nanowires. Positive resists additionally provide better adhesion to many substrate layer types, e.g., silicon, and provide greater mechanical strength. This allows for more precise templating or masking in the positioning of nanowires. As noted, this layer may be removed in subsequent steps or it may be allowed to remain on the overall device to provide additional structural features, e.g., insulation, moisture barriers, fluidic conduits, etc. A wide variety of different positive and negative resists are generally commercially available, e.g., from DuPont, i.e., DuPont 8000 series resists.

Once the nanowires are deposited, the masking layer may be removed from the substrate to allow for additional processing. Alternatively, where various integration elements are prepositioned on the wafer or substrate, it may not be necessary to remove the masking layer. In fact, in some cases, the masking layer may provide a barrier or insulation between electrical or fluidic elements of a device. In the case of such masking layers, it will be appreciated that any of a variety of resist layers are readily commercially available for this process, including, e.g., polyimide or PMMA based resists, or any of a variety of resists that are generally commercially available.

Figure 6:
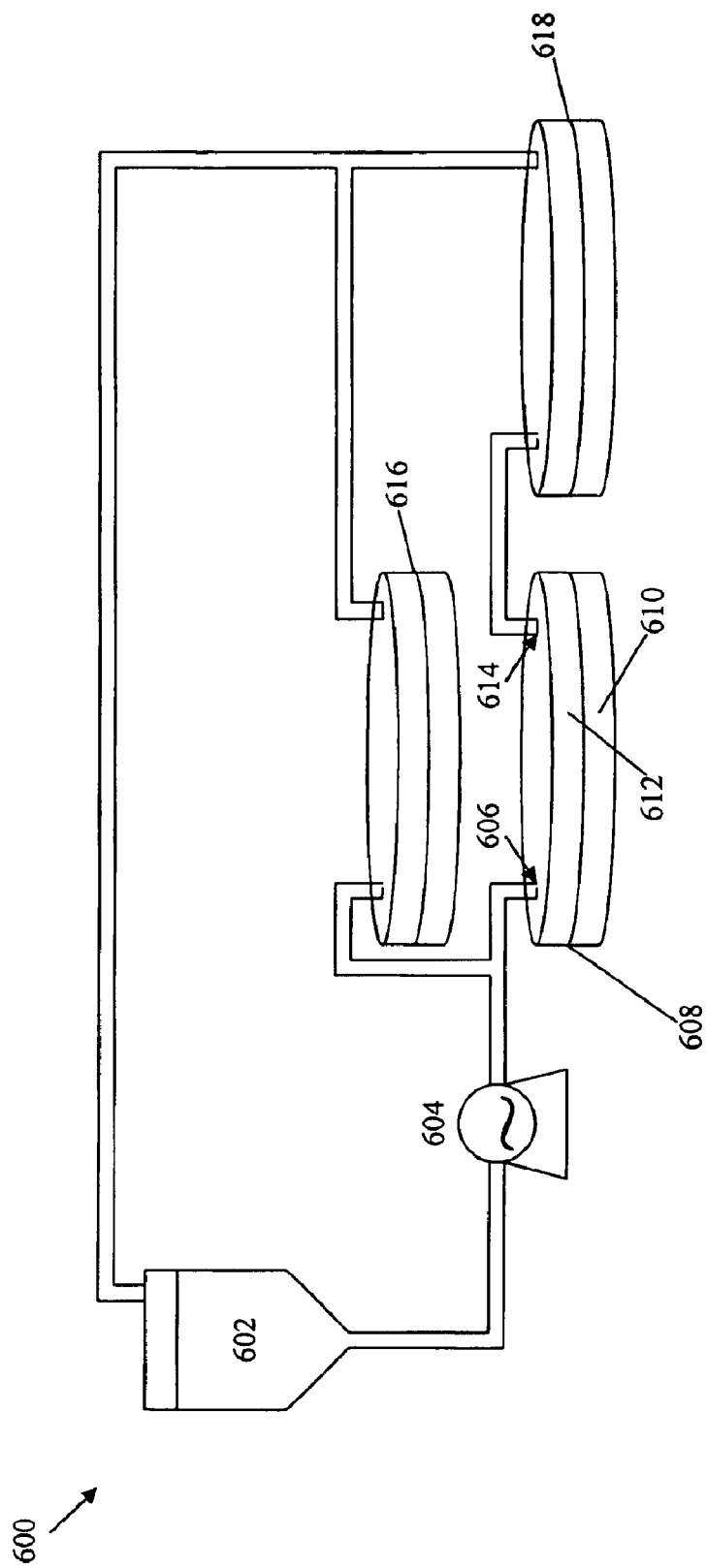
FIG. 6 is a schematic illustration of an overall system for positioning and aligning nanowires onto substrate surfaces.

One of the advantages of the invention is its applicability to manufacturing on a commercial scale. In accordance with this advantage, FIG. 6 schematically illustrates an overall system that may be used in commercial scale alignment and deposition of nanowires onto substrates and subsequent device integration. As shown, the system 600 includes a source of nanowire containing fluid 602. A pump 604 delivers the fluid to the inlet port 606 of a deposition module 608 which would typically include a base substrate 610 onto which nanowires are to be deposited, and a manifold element 612 which directs the flowing nanowires to selected regions on the surface of the substrate to which the manifold is mated. Following contact with the substrate, the fluid exits the manifold 612 through outlet port 614, where the fluid and the nanowires still contained therein are reclaimed, e.g., in a reclamation vessel (not shown) or recycled back into source 602 (as shown). Typically, the module 606 may be multiplexed either in parallel, e.g., as shown by module 616, or in series, as shown by module 618, provided there is a sufficient concentration of nanowires in the fluid, in order to increase the throughput of the deposition process.

EXAMPLES

Example 1

Controlled Positioning and Flow Alignment of Nanowires on a Wafer Scale

Nanowires were positioned and oriented on a substrate and subsequently integrated with electrical connections in accordance with the invention.

Silicon nanowires used for flow alignment were synthesized by gold cluster mediated chemical vapor deposition methods, and the resulting nanowires were suspended in ethanol solution via ultrasonication.

A poly(dimethylsiloxane) (PDMS) stamp, e.g., as shown in FIG. 1, was fabricated by photolithography. The PDMS stamp had a three-inch diameter, with eight parallel channels spaced 7 mm apart with each channel having a width of 500 $\mu$m, and a depth of ~200 $\mu$m.

A silicon substrate wafer (surface oxidized, 600 nm oxide) to be used in flow assembly was functionalized with an $NH_2$-terminated self-assembled monolayer (SAM) by immersion in a 1 mM chloroform solution of 3-aminopropyltriethoxysilane (APTES) for 30 min, followed by heating at 110° C. for 10 min.

Alignment of nanowires was performed by conforming the PDMS stamp to the functionalized surface of the silicon substrate. The ethanol solution of nanowires was flowed into the parallel channels of the stamp through one port (inlet) and out through the other port. Flow was either induced by gravity, e.g., tilting the substrate to ~40°, or through application of a positive pressure to the inlet port.

Figure 7:
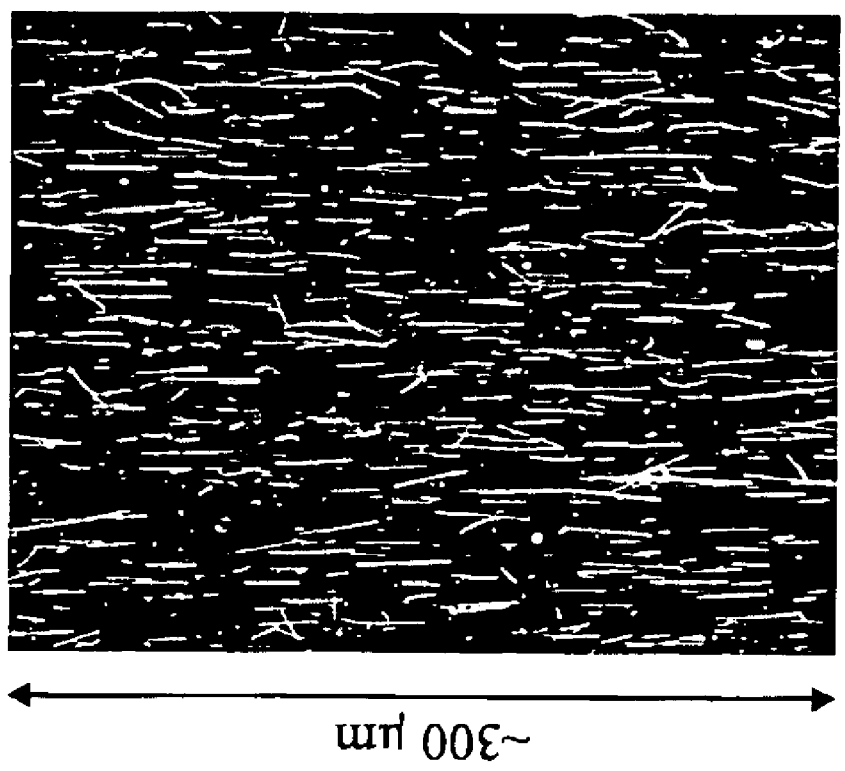
FIG. 7 is an SEM image of oriented nanowires immobilized on a substrate surface.

Once the nanowire solution was delivered through the stamp, the PDMS stamp was removed, and the surface of the substrate wafer was coated with a photoresist. FIG. 7 shows an SEM image of flow aligned nanowires immobilized on a substrate. As can be seen, a substantial majority of the nanowires are substantially longitudinally oriented in a single direction in the direction of flow during the deposition process.

Figure 8B:
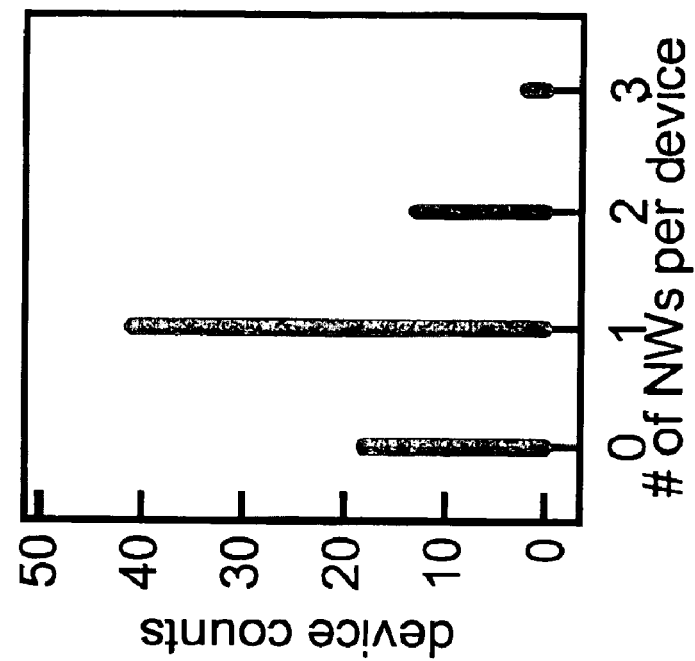
FIG. 8B shows a plot of expected frequency of 0, 1, 2 and 3 wire connections between electrode pairs.
Figure 8A:
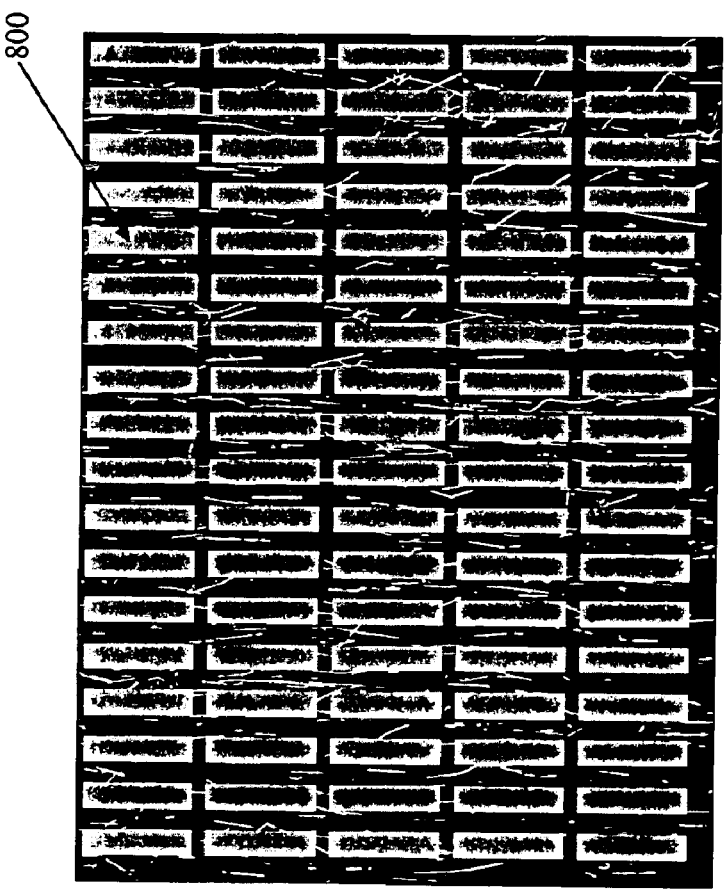
FIG. 8A is a postulated electrode deposition over the oriented nanowire population shown in FIG. 7.

By superimposing virtual or postulated pairs of electrical contacts over the oriented nanowires, one can estimate the efficacy of the fabrication process in producing functioning nanowire containing devices, e.g., devices in which one or more nanowires connects a pair of electrical contacts. A virtual electrical contact pattern overlaid on the oriented nanowires is shown in FIG. 8A. Examination of overlay in FIG. 8A allows for an estimate of 0, 1, 2 and 3 wire connections between electrode pairs. FIG. 8B provides a plot of the distribution of connections in the estimated devices of FIG. 8A. As can be seen, functional device yield, e.g., percentage of devices showing one or more connection between a pair of electrical contacts, is approximately 75%.

Figure 9:
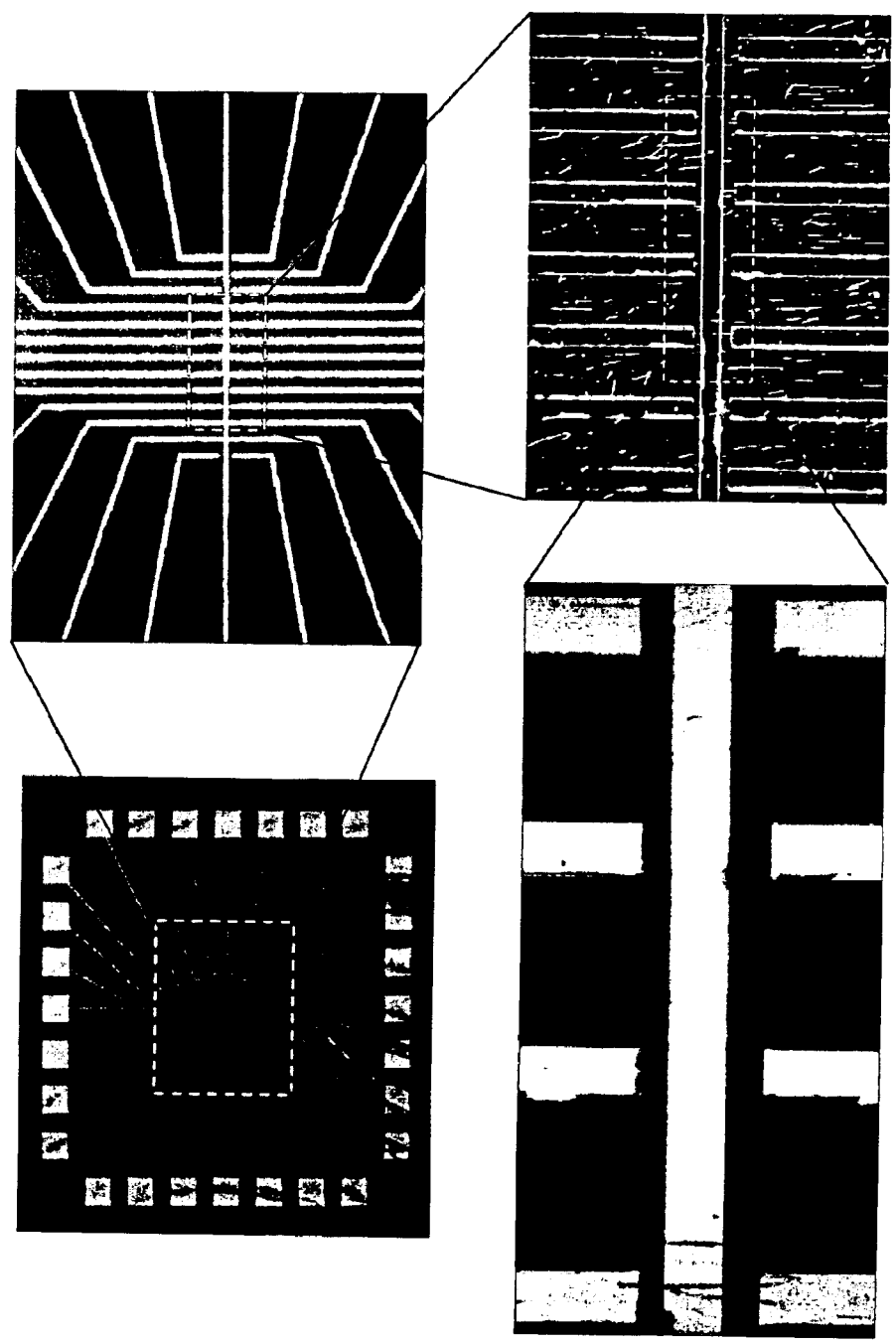
FIG. 9 shows aligned nanowires connected to electrical contact pairs.

Photolithography was used to selectively remove portions of the photoresist, and electron-beam evaporation was performed to define the metal contacts on to the nanowires in selected locations on the substrate surface. The pattern of electrodes was as shown in FIG. 1. FIG. 9 illustrates the overall device, as well as expanded views of the electrodes and nanowire connections between electrode pairs. Electrode pairs are made up between the common central electrode and each of the separate orthogonally oriented electrodes. Each connected electrode pair, e.g., connection between the central electrode and an orthogonal electrode, represents an operation element of a nanowire based device.

Although described in considerable detail above, it will be appreciated that various modifications may be made to the above-described invention, while still practicing the invention as it is delineated in the appended claims. All publications and patent documents cited herein are hereby incorporated herein by reference in their entirety for all purposes to the same extent as if each such document was individually incorporated herein.

What is claimed is:

1. A method of depositing a population of nanowires on a surface of a substrate substantially in a desired orientation, comprising:

providing one or more fluid channels on the surface of the substrate, wherein at least one fluid channel has at least one of a widened region or a thinned region along a length of the channel;

flowing a first fluid containing nanowires over the surface in a first direction through the one or more fluid channels, the first direction being parallel to a desired longitudinal orientation of the nanowires; and permitting a population of nanowires in the first fluid to become immobilized onto the surface, a longitudinal dimension of the nanowires from the first fluid being substantially oriented in the first direction.

2. The method of claim 1, comprising providing a plurality of microscale fluid channels over different regions of the surface of the substrate, and flowing the first fluid through each of the fluid channels in the first direction.

3. The method of claim 2, wherein at least one of the microscale fluid channels comprises a widened region, the nanowires preferentially immobilizing in the widened region.

4. The method of claim 2, wherein the step of providing a plurality of microscale fluid channels on the substrate surface comprises providing a manifold having at least first and second grooves disposed in its first surface, and mating the first surface of the manifold with the surface of the substrate to define a first and second enclosed channels on the first surface of the substrate.

5. The method of claim 2, wherein the step of providing a plurality of microscale fluid channels on the substrate surface comprises providing a layer of polymeric material on the substrate surface and defining the microscale fluid channels in the layer of polymeric material to provide fluidic communication to at least a portion of the substrate surface.

6. The method of claim 5, wherein the layer of polymeric material comprises a photoresist, and the step of defining the microscale fluid channels comprises exposing a portion of the layer of photoresist and developing the layer of photoresist to define the microscale fluid channels.

7. The method of claim 5, further comprising providing a cover layer over the layer of polymeric material to seal and enclose the microscale fluid channel, the cover layer comprising at least a first port disposed therethrough and positioned to provide fluid access to the microscale fluid channels.

8. The method of claim 7, wherein the photoresist comprises a positive photoresist.

9. The method of claim 1, wherein the permitting step comprises providing the first surface of the substrate as a functionalized first surface that is capable of binding the nanowires from the first fluid.

10. The method of claim 9, wherein the step of providing the first surface of the substrate as a functionalized first surface comprises providing functional groups on only a portion of the first surface.

11. The method of claim 10, wherein the portion of the first surface comprises one or more electrical contacts.

12. The method of claim 10, wherein the functional groups comprise protectable or deprotectable functional groups.

13. The method of claim 12, wherein the functional groups comprise photodeprotectable functional groups.

14. The method of claim 1, further comprising the step of providing at least first and second electrical contacts on the surface of the substrate, the first and second electrical contacts being separated by a first distance in the first direction on the first substrate, the first distance being less than an average length of the nanowires in the first fluid containing nanowires.

15. The method of claim 14, wherein the first and second electrical contacts are provided on the surface of the substrate before flowing the fluid containing the nanowires over the first surface.

16. The method of claim 14, wherein the first and second electrical contacts are provided on the surface of the substrate after the nanowires have been permitted to be immobilized on the first surface of the substrate.

17. The method of claim 1, further comprising:

functionalizing at least a first portion of the surface of the substrate, prior to flowing the first fluid containing the nanowires over the first surface in the first direction, whereby the nanowires immobilize to the first portion of the surface of the substrate that has been functionalized.

18. The method of claim 17, wherein the first fluid is flowed over a second portion of the surface of the substrate, the first portion of the surface and the second portion of the surface at least partially overlapping.

19. The method of claim 17, wherein the first surface of the substrate comprises at least one other circuit element to which nanowires are to be coupled.

20. The method of claim 19, wherein the at least one other circuit element comprises at least a first pair of electrical contacts.

21. The method of claim 20, wherein the first pair of electrical contacts comprises first and second metal contact regions on the surface of the substrate.

22. The method of claim 19, wherein the at least one other circuit element comprises a nanowire circuit element.

23. The method of claim 22, wherein the nanowire circuit element comprises doping different from doping in the nanowires in the first fluid.

24. The method of claim 19, wherein the circuit element comprises an integrated circuit element disposed on the substrate.

25. The method of claim 24, wherein the integrated circuit element comprises a nanoscale circuit element.

26. A method of positioning nanowires in one or more predetermined regions on a substrate, comprising:

providing a substrate having a first surface;

overlaying the first surface with a mask, the mask providing fluid access to one or more first predetermined regions on the first surface, but not to one or more second predetermined regions on the surface of the substrate, wherein the mask comprises at least one fluid passage having first and second regions of dissimilar dimension;

flowing fluid containing nanowires through the mask and into contact with the first predetermined regions of the substrate surface; and permitting the nanowires contained in the nanowire containing fluid to immobilize in the first predetermined regions of the surface of the substrate.

27. The method of claim 26, wherein the step of providing the substrate comprising the first surface comprises providing the first surface as a functionalized surface capable of binding to the nanowires.

28. The method of claim 26, wherein the flowing step comprises flowing the fluid containing the nanowires over the first predetermined regions in a first direction to cause the nanowires to immobilize in the first predetermined regions on the surface of the substrate longitudinally oriented substantially in the first direction.

29. The method of claim 26, further comprising providing at least first and second electrical contacts in the one or more first predetermined regions, whereby one or more nanowires immobilize in contact with both the first and second electrical contacts in the first predetermined region.

30. The method of claim 29, wherein the first and second electrical contacts are provided in the first predetermined regions of the substrate before the nanowires are immobilized in the first predetermined regions.

31. The method of claim 29, wherein the first and second electrical contacts are provided in the first predetermined regions of the substrate after the nanowires are immobilized in the first predetermined regions.

32. A nanowire based device, comprising:

at least a first population of nanowires immobilized in at least a first region of a surface of a substrate, the first population of nanowires being substantially longitudinally oriented in a first direction;

at least first and second electrical contacts disposed on the first region of the surface of the substrate; and wherein the first and second electrical contacts are separated from each other on the first surface of the substrate in the first direction by a distance that is less than 50% of an average length of the nanowires in the first population of nanowires.

33. The nanowire based device of claim 32, wherein at least one nanowire in the population of nanowires is positioned in contact with both the first and second electrical contacts.

34. The nanowire based device of claim 32, wherein the first and second electrical contacts are separated by a distance that is less than 10 $\mu$m.

35. The nanowire based device of claim 34, wherein the first and second electrical contacts are separated by a distance that is less than 1 $\mu$m.

36. The nanowire based device of claim 34, further comprising at least third and fourth electrical contacts separate from the first and second electrical contacts, and disposed on the first region of the first surface, wherein the third and fourth electrical contacts are separated from each other on the first surface of the substrate in the first direction by less than an average length of the nanowires in the population of nanowires.

37. The nanowire based device of claim 34, further comprising:

at least a second population of nanowires immobilized in at least a second region of the surface of the substrate, the second population of nanowires being substantially longitudinally oriented in a second direction;

at least third and fourth electrical contacts disposed on the second region of the surface of the substrate; and wherein the third and fourth electrical contacts are separated from each other on the first surface of the substrate in the second direction by less than about 1 $\mu$m.

38. The nanowire based device of claim 34, further comprising:

at least a second population of nanowires immobilized in at least a second region of the surface of the substrate, the second population of nanowires being substantially longitudinally oriented in a second direction;

at least third and fourth electrical contacts separate from the first and second electrical contacts, and disposed on he first region of the first surface, wherein the third and fourth electrical contacts are separated from each other on the first surface of the substrate in the first direction by less than about 1 $\mu$m; and at least fifth and sixth electrical contacts disposed on the second region of the surface of the substrate, wherein the fifth and sixth electrical contacts are separated from each other on the first surface of the substrate in the second direction by less than about 1 $\mu$m.

39. A system for orienting nanowires on a surface of a substrate, comprising:

a substrate having a first surface;

at least one fluid channel disposed on the first surface, wherein the at least one fluid channel comprises one or more of a widened region or a thinned region along a length of the channel corresponding to a position on the surface of the substrate where it is desired to position nanowires; and a fluid direction system coupled to the at least one fluid channel and coupled to a source of fluid containing nanowires, for flowing the fluid containing nanowires in a first direction through the at least one fluid channel.

40. The system of claim 39, wherein the at least one fluid channel is defined in a first surface of a manifold, the first surface of the manifold being mated to the first surface of the substrate to dispose the fluid channel on the first surface of the substrate.

41. The system of claim 40, further comprising at least a second fluid channels disposed on the first surface of the substrate.

42. The system of claim 41, wherein the first and second fluid channels are fluidly coupled to a first fluid inlet port, the first fluid inlet port being fluidly coupled to the source of fluid containing nanowires.

43. A system for positioning nanowires on a substrate, comprising:

a substrate having a first surface;

a masking element disposed over the first surface and providing a plurality of fluid passages to one or more discrete regions of the first surface, wherein the masking element comprises a manifold having a plurality of fluid channels disposed therein, wherein one or more of the fluid channels comprises a widened region corresponding to a position on the surface of the substrate where it is desired to position nanowires, the widened region providing longer residence time within the widened region for a fluid flowing through the one or more fluid channels, the plurality of fluid channels having as at least one wall of the channels the one or more regions of the surface of the substrate, the fluid channels providing the one or more fluid passages to the first surface of the substrate;

a source of fluid containing nanowires fluidly coupled to the plurality of fluid passages on the masking element; and a fluid direction system for delivering fluid from the fluid source to the plurality of fluid passages.

44. The system of claim 43, wherein one or more of the plurality of fluid channels comprises a thinned region that provides a shorter average diffusion distance between a fluid flowing through the thinned region of the one or more fluid channels and the surface of the substrate at the thinned region of the one or more fluid channels.

45. The system of claim 43, wherein the manifold comprises a flexible material.

46. The system of claim 45, wherein the flexible material comprises a polymeric material.

47. The system of claim 45, wherein the flexible material comprises PDMS.

48. A method of positioning nanostructures on a surface of a substrate, comprising:

contacting the surface of the substrate with a fluid containing the nanostructures;

establishing a standing wave through the fluid, the standing wave localizing nanostructures preferentially in first selected regions of the surface of the substrate and not in second selected regions of the substrate.

* * * * *